(12) United States Patent
Kobayashi et al.

(10) Patent No.: US 11,193,980 B2
(45) Date of Patent: *Dec. 7, 2021

(54) INSPECTION METHOD AND MANUFACTURING METHOD OF ELECTRICAL STORAGE DEVICE

(71) Applicant: TOYOTA JIDOSHA KABUSHIKI KAISHA, Toyota (JP)

(72) Inventors: Kiwamu Kobayashi, Anjo (JP); Takeshi Goto, Kasugai (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 472 days.

This patent is subject to a terminal disclaimer.

(21) Appl. No.: 16/182,683

(22) Filed: Nov. 7, 2018

(65) Prior Publication Data

US 2019/0198942 A1 Jun. 27, 2019

(30) Foreign Application Priority Data

Dec. 25, 2017 (JP) .............................. JP2017-248109

(51) Int. Cl.
*G01R 31/3842* (2019.01)
*G01R 31/385* (2019.01)
(Continued)

(52) U.S. Cl.
CPC ... *G01R 31/3865* (2019.01); *G01R 19/16542* (2013.01); *G01R 31/389* (2019.01);
(Continued)

(58) Field of Classification Search
CPC .............. G01R 31/3865; G01R 31/389; G01R 19/16542; G01R 31/3644; G01R 31/3842;
(Continued)

(56) References Cited

U.S. PATENT DOCUMENTS 8,334,699 B2 * 12/2012 Asakura ................ H01M 10/48
324/426
10,539,622 B2 * 1/2020 Goto .................... H01M 10/441
(Continued)

FOREIGN PATENT DOCUMENTS

CN 1391305 A 1/2003
EP 1 867 029 A2 12/2007
(Continued)

OTHER PUBLICATIONS

U.S. Appl. No. 16/013,421, Kiwamu Kobayashi et al., filed Jun. 20, 2018.
(Continued)

*Primary Examiner* — Vinh P Nguyen
(74) *Attorney, Agent, or Firm* — Sughrue Mion, PLLC (57) ABSTRACT

An inspection method of a present electrical storage device includes: constituting a circuit with the electrical storage device being charged and a power supply, and passing a current by the power supply to the circuit in a direction of charging or discharging the electrical storage device; and in passing the current, determining the quality of the electrical storage device based on a converging state of the passing current. In passing the current, an output voltage of the power supply is changed from an initial value with the passage of time.

11 Claims, 9 Drawing Sheets

(51) Int. Cl.
   *H01M 10/48* (2006.01)
   *G01R 19/165* (2006.01)
   *G01R 31/389* (2019.01)
   *G01R 31/392* (2019.01)
   *H01M 10/44* (2006.01)

(52) U.S. Cl.
   CPC ........ *G01R 31/3842* (2019.01); *G01R 31/392* (2019.01); *H01M 10/44* (2013.01); *H01M 10/482* (2013.01); *H01M 10/488* (2013.01)

(58) Field of Classification Search
   CPC .. G01R 31/386; G01R 31/392; G01R 31/382; G01R 31/388; G01R 31/36; G01R 31/378; G01R 31/385; G01R 31/387; Y02E 60/10; H01M 10/4285; H01M 10/48; H01M 10/482; H01M 2010/4271; H01M 10/44; H01M 10/446; H01M 10/4257; H01M 10/488; H01M 8/0491; H01M 8/04649; H01M 8/04902; H01M 10/441; H01M 10/42; H01M 10/4207; H01M 8/04559; Y02T 10/70; Y02T 10/7072; Y02T 90/12; Y02T 10/62; Y02T 10/92; H02J 7/0048; H02J 7/0021; H02J 7/0068; H02J 7/04; H02J 7/007182; H02J 7/007194; H02J 7/02; H02J 7/1423; H02J 3/32; H02J 7/005; H02J 7/008; H02J 7/00302; H02J 7/007184; H02J 7/0047
   See application file for complete search history.

(56) References Cited

U.S. PATENT DOCUMENTS

| | | | |
|---|---|---|---|
| 10,845,422 B2 * | 11/2020 | Kobayashi | G01R 31/392 |
| 10,847,849 B2 * | 11/2020 | Goto | H01M 10/48 |
| 2003/0006735 A1 | 1/2003 | Kawakami et al. | |
| 2010/0127670 A1 | 5/2010 | Chen et al. | |
| 2012/0130661 A1 | 5/2012 | Hagimori et al. | |
| 2013/0335009 A1 * | 12/2013 | Katsumata | G01R 21/06 320/107 |
| 2015/0145524 A1 | 5/2015 | Duncan et al. | |
| 2016/0054370 A1 | 2/2016 | Fomin et al. | |
| 2016/0178689 A1 | 6/2016 | Okita | |
| 2019/0011502 A1 * | 1/2019 | Kobayashi | G01R 31/392 |

FOREIGN PATENT DOCUMENTS

| | | |
|---|---|---|
| JP | 2001-006750 A | 1/2001 |
| JP | 2003-059544 A | 2/2003 |
| JP | 2005-149867 A | 6/2005 |
| JP | 2006-333553 A | 12/2006 |
| JP | 2010-153275 A | 7/2010 |
| JP | 2013-172552 A | 9/2013 |
| JP | 2014-150610 A | 8/2014 |
| JP | 2014-222603 A | 11/2014 |
| JP | 2015-220164 A | 12/2015 |
| JP | 2016-91872 A | 5/2016 |
| KR | 1020070112856 A | 11/2007 |
| WO | 2006/098157 A2 | 9/2006 |

OTHER PUBLICATIONS

Office Action issued to U.S. Appl. No. 16/414,864 dated May 15, 2020.

Notice of Allowance issued to U.S. Appl. No. 16/414,864 dated Aug. 24, 2020.

U.S. Appl. No. 16/414,864, filed May 17, 2019 (Kobayashi).

* cited by examiner

INSPECTION METHOD AND MANUFACTURING METHOD OF ELECTRICAL STORAGE DEVICE

INCORPORATION BY REFERENCE

The disclosure of Japanese Patent Application No. 2017-248109 filed on Dec. 25, 2017 including the specification, drawings and abstract is incorporated herein by reference in its entirety.

BACKGROUND

1. Technical Field

The present disclosure relates to an inspection method for determining the quality of an electrical storage device. The present disclosure also relates to a manufacturing method of an electrical storage device, the method including the inspection method of the electrical storage device as one of the steps.

2. Description of Related Art

A variety of inspection methods have conventionally been proposed for determining the quality of secondary batteries and other electrical storage devices. For example, in Japanese Patent Application Publication No. 2010-153275, a retention step of retaining the secondary battery, that is a determination target, in a pressurized state is performed, and a battery voltage is measured before and after the retention step. A difference in the battery voltage before and after the retention step is exactly a voltage drop amount caused by retention. A battery having a large voltage drop amount indicates that the battery has a large self-discharge amount. Accordingly, the quality of the secondary battery can be determined based on the size of the voltage drop amount. Such an inspection method may be performed as one step of a manufacturing method.

SUMMARY

However, the conventional quality determination of the secondary battery has following problems. That is, the quality determination takes time. The reason why the quality determination takes time is that a long retention time is needed in the retention step in order to attain a voltage drop amount large enough to be significant. This may be attributed to a contact resistance in voltage measurement. To measure the voltage, a measuring instrument is connected across both the terminals of a secondary battery. At that time, a contact resistance is unavoidably generated between the terminals of the secondary battery and the terminals of the measuring instrument, so that the result of a measurement is influenced by the contact resistance. Whenever the terminals of the secondary battery and the terminals of the measuring instrument are connected, a different contact resistance is generated. Accordingly, unless the voltage drop amount itself is sufficiently large, variation in contact resistance among respective measurements is unignorable.

Furthermore, the accuracy of the voltage measurement itself is not very high. This is because the voltage measurement is inevitably influenced by a voltage drop in an electric current path in the measurement. Moreover, places of contact between the terminals of the secondary battery side and the terminals of the measuring instrument side are different to some extent every time the connection is made. Hence, the level of a voltage drop also varies every time the voltage measurement is performed. Accordingly, it may be conceived to shorten the measurement time of a self-discharge amount and to thereby enhance the measurement accuracy by using current measurement instead of the voltage measurement. Unlike the voltage measurement, the current measurement is hardly influenced by the place of contact since an electric current is constant anywhere within a circuit. However, simply replacing the voltage measurement with the current measurement does not provide successful determination. This is because the result of measurement depends on variation in various conditions, such as a charge voltage of a secondary battery and measurement environments.

The present disclosure provides an inspection method and a manufacturing method of an electrical storage device that achieve swift determination of the quality of the electrical storage device regardless of variations in conditions.

An inspection method of an electrical storage device in a first aspect of the present disclosure includes: constituting a circuit with the electrical storage device being charged and a power supply, and passing a current by the power supply to the circuit in a direction of charging the electrical storage device or in a direction of discharging the electrical storage device, an output voltage of the power supply being changed from an initial value with the passage of time; and in passing the current, determining the quality of the electrical storage device based on a converging state of the current passing through the circuit.

In the inspection method of an electrical storage device in the above aspect, the quality of the electrical storage device is determined by measuring a current passing through a circuit including the electrical storage device and a power supply. That is, a change in the circuit current caused by a voltage drop based on self-discharge of the electrical storage device is used as a determination criterion. Since current measurement can be performed with higher accuracy than voltage measurement, more adequate determination can be made in a shorter time. Here, changing the output voltage of the power supply from an initial value with the passage of time accelerates converging timing of a circuit current and achieves further shortening in the determination time.

The first aspect may include setting the initial value to a voltage value before start of inspection of the electrical storage device being charged. In passing the current, the output voltage after the start of the inspection may be changed such that the output voltage increases in such a manner that a margin of increase in the output voltage is increased more as an increase of the current after the start of the inspection is larger, and in determining the quality of the electrical storage device, the quality of the electrical storage device may be determined based on time required until the current converges. Thus, feeding back the circuit current to the margin of increase in the output voltage of the power supply can further accelerate the converging timing of the circuit current.

In the first aspect where the circuit current is fed back to the output voltage of the power supply, the output voltage may be calculated, by using a constant that is a product of a parasitic resistance value of the circuit and a preset positive coefficient that is less than one, as a sum of a voltage of the electrical storage device and a product of a value of the current of the circuit and the constant. Thus, the margin of increase in the output voltage of the power supply can easily be calculated with a known value, and the output voltage of the power supply can be increased.

In the first aspect where the circuit current is fed back to the output voltage of the power supply, the output voltage may be calculated, by using a virtual resistance value, as a sum of the voltage of the electrical storage device and a product of the value of the current of the circuit and a sum of the parasitic resistance value of the circuit and the virtual resistance value, the virtual resistance value being used when the increase of the output voltage is replaced with a model where an absolute value of the virtual resistance that is a virtual resistance having a negative or zero resistance value increases in place of the output voltage that is set to be constant. Also with such configuration, the margin of increase in the output voltage of the power supply can appropriately be calculated, and the output voltage of the power supply can be increased.

The first aspect may include: before constituting the circuit, acquiring the voltage value before the start of the inspection of the electrical storage device being charged; before passing the current, coinciding the output voltage with the voltage value; and determining an initial output voltage of the power supply in passing the current by adjusting the output voltage such that the current passing through the circuit in the state after the output voltage is coincided with the voltage value is negated.

The state of change in the circuit current after the start of the inspection is largely influenced by the setting accuracy of the output voltage of the power supply at the start time of inspection. When the initial output voltage of the power supply is higher than the initial voltage of the electrical storage device, an overshoot in which the circuit current exceeds a convergence value may occur. Meanwhile, when the initial output voltage of the power supply is lower than the initial voltage of the electrical storage device, the direction of a current flow is temporarily reversed, and then a convergence value is reached. In any case, the converging timing of the current is considerably delayed. Accordingly, accurately setting the initial output voltage of the power supply as in the present aspect can ensure that the circuit current is converged early.

In the first aspect, in passing the current, the voltage of the power supply at the start of inspection may be set to a value obtained by adding a product of an initial self-discharge current of the electrical storage device without a defect and the parasitic resistance of the circuit to the voltage of the electrical storage device, and in determining the quality of the electrical storage device, the quality of the electrical storage device may be determined based on whether or not an increase in the current after the start of the inspection is within a preset level.

Thus, setting the initial output voltage of the power supply to a voltage higher than the initial voltage of the electrical storage device makes it possible to set the circuit current such that the self-discharge current of the nondefective device is negated. Accordingly, self-discharge of the electrical storage device after the start of inspection can practically be adjusted to zero. Therefore, inspection can be performed based only on whether a significant increase in the circuit current is present after the start of inspection. This makes it possible to inspect the electrical storage device in a shorter time.

In an inspection method of an electrical storage device in an aspect of determining the quality based on the convergence time of the circuit current, the voltage of the power supply at the start of the inspection may be set to a value obtained by adding a product of the initial self-discharge current of the electrical storage device without a defect and the parasitic resistance of the circuit to the voltage value being set or determined in passing the current. This is because setting the initial output voltage of the power supply higher than the initial voltage of the electrical storage device also results in further reduction in the convergence time of the circuit current.

The first aspect may include measuring the voltage value before the start of inspection of the electrical storage device being charged, in which measuring the voltage value and passing the current may be performed under the condition that the electrical storage device has a constant temperature. When the temperature of the electrical storage device changes in the middle of inspection, the voltage of the electrical storage device and the circuit current are also influenced by the change. Accordingly, determination of convergence and increase of the circuit current may also be influenced. In the present aspect, such influence can be eliminated by setting the temperature of the electrical storage device constant, which allows appropriate determination regarding the convergence or the increase of the circuit current.

The first aspect that performs a voltage measurement step may further include, before measuring the voltage value, and in the middle of measuring the voltage value and passing the current, repeatedly acquiring the temperature in parallel to measuring the voltage value and passing the current, and continuing to measure the voltage value and passing the current when fluctuation of the temperature being acquired is within a preset acceptable fluctuation range. With such configuration, only when the temperature fluctuation in the electrical storage device is within an acceptable fluctuation range, measuring the voltage value and passing the current can be continued.

The first aspect may include measuring the voltage value before the start of inspection of the electrical storage device being charged, in which the electrical storage device may have an external appearance of a flat square shape, and measuring the voltage value and passing the current may be performed under the condition that the electrical storage device is pressurized in a thickness direction of the electrical storage device. In such a pressurized state, an influence of a metal foreign substance that may be interposed between electrode plates of the electrical storage device is emphasized. Consequently, inspection under such a situation allows more appropriate inspection of the electrical storage device.

A manufacturing method of an electrical storage device in a second aspect of the present disclosure includes: performing an initial charging of an electrical storage device being assembled and uncharged to a preset charging state to provide a charged electrical storage device; and inspecting the electrical storage device being charged by the inspection method according to any one of the first aspect. This makes it possible to shorten the time required for an inspection step that is a process of the manufacturing method.

With the present configuration, there is provided an inspection method and a manufacturing method of an electrical storage device that achieve swift determination in quality of the electrical storage device regardless of variation in conditions.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
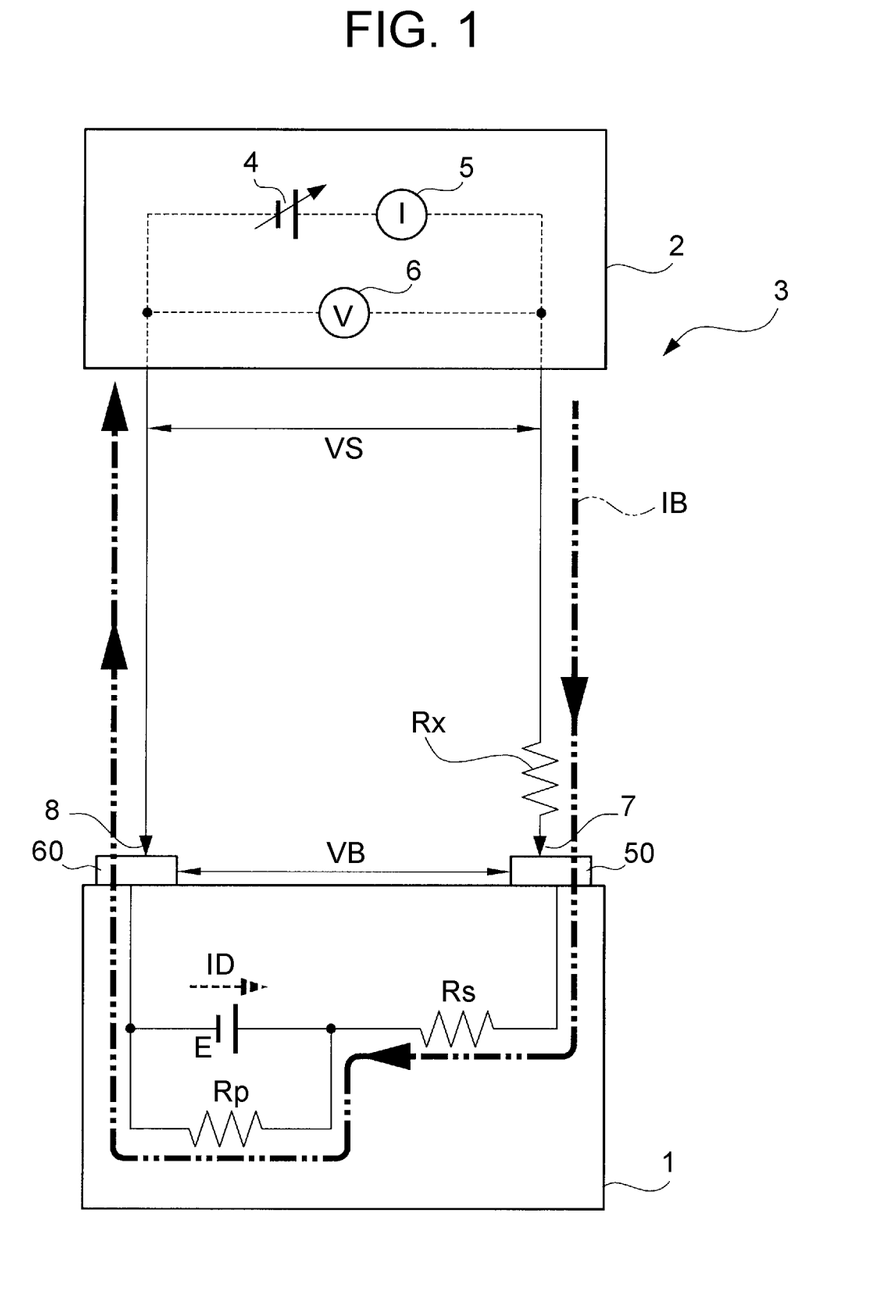
FIG. 1 is a circuit diagram illustrating the configuration of a circuit assembled in order to perform an inspection method of a secondary battery in an embodiment.

Hereinafter, embodiments that embody the present disclosure are described in detail with reference to the accompanying drawings. As illustrated in FIG. 1, an inspection method of an electrical storage device in the present embodiment is performed in the state where a secondary battery 1 that is an electrical storage device to be inspected is connected to a measuring device 2 to assemble a circuit 3. First, the basic principle of the inspection method of the secondary battery 1 with a measuring device 2 will be described.

Basic Principle

Figure 2:
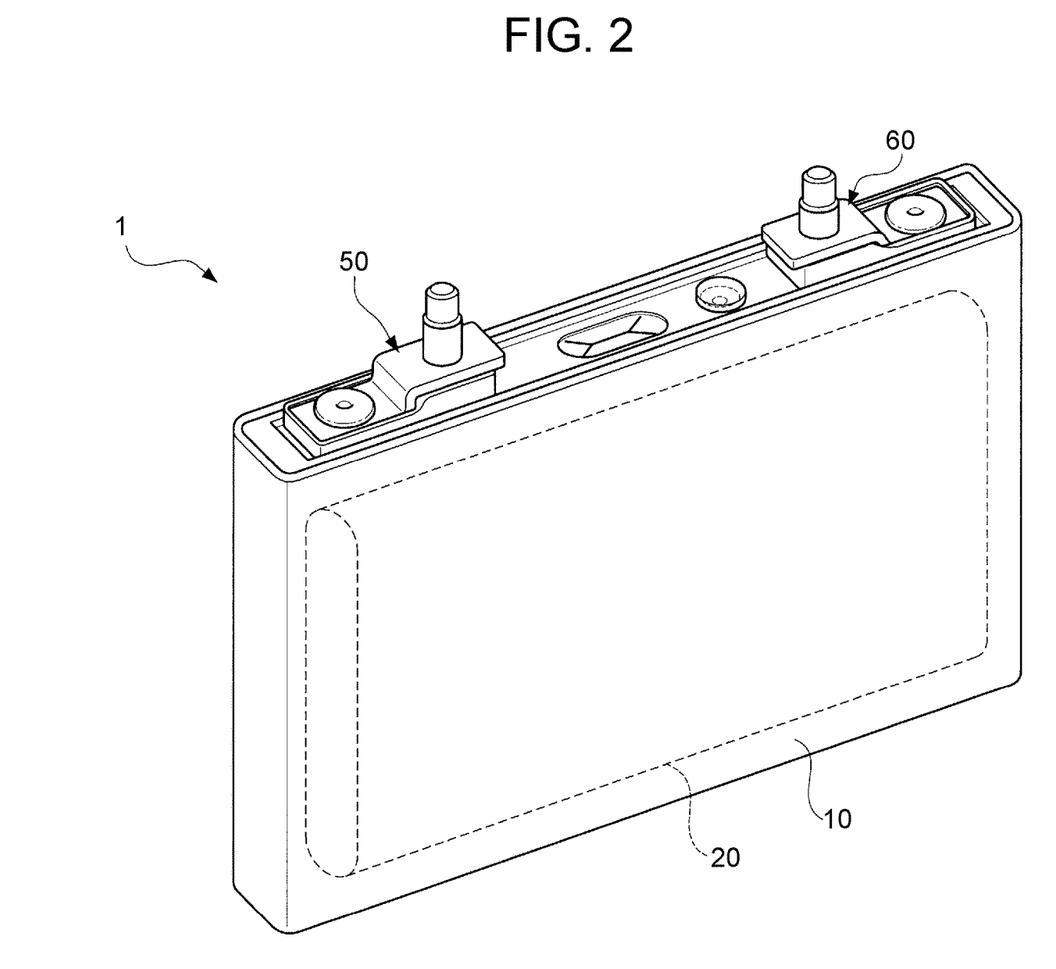
FIG. 2 is an external view illustrating an example of the secondary battery to be inspected in the embodiment.

The secondary battery 1, which is schematically illustrated in FIG. 1, has actually an external appearance in a flat square shape as illustrated in FIG. 2, for example. The secondary battery 1 of FIG. 2 is made of an electrode laminate 20 incorporated in an outer casing 10. The electrode laminate 20 is a laminate of a positive electrode plate and a negative electrode plate with a separator provided therebetween. The outer casing 10 houses an electrolytic solution in addition to the electrode laminate 20. The secondary battery 1 has positive and negative terminals 50, 60 provided on the external surface thereof. Without being limited to the square shape as in FIG. 2, the secondary battery 1 may have other shapes such as a cylindrical shape.

Further description will be given of FIG. 1. In FIG. 1, the secondary battery 1 is schematically illustrated. The secondary battery 1 in FIG. 1 is expressed as a model that includes an electromotive element E, an internal resistance Rs, and a short-circuit resistance Rp. The internal resistance Rs is placed in series with the electromotive element E. The short-circuit resistance Rp models an electric conduction route provided by a minute metal foreign substance which may invade into the electrode laminate 20. The short-circuit resistance Rp is placed in parallel with the electromotive element E.

The measuring device 2 has a direct-current power supply 4, an ammeter 5, a voltmeter 6, and probes 7, 8. The ammeter 5 is placed in series with the direct-current power supply 4, while the voltmeter 6 is placed in parallel with the direct-current power supply 4. The direct-current power supply 4 has a variable output voltage VS. The direct-current power supply 4 is used to apply the output voltage VS to the secondary battery 1 as described later. The ammeter 5 measures a current passing through the circuit 3. The voltmeter 6 measures the voltage between the probes 7, 8. The probes 7, 8 of the measuring device 2 are bonded with the terminals 50, 60 of the secondary battery 1 to constitute the circuit 3 in FIG. 1.

The circuit 3 in FIG. 1 further has a parasitic resistance Rx. The parasitic resistance Rx includes a contact resistance between the probes 7, 8 and the terminals 50, 60 in addition to a lead wire resistance of each portion of the measuring device 2. Although the parasitic resistance Rx is illustrated as if it exists only in the lead wire on the probe 7 side in FIG. 1, this is simply for the convenience of graphic illustration. The parasitic resistance Rx is present over the entire circuit 3 in actuality.

In the inspection method with the measuring device 2, the size of a self-discharge amount of the secondary battery 1 is inspected. When the self-discharge amount is large, the secondary battery 1 is defective, whereas when the self-discharge amount is small, the secondary battery 1 is non-defective. Accordingly, first, the secondary battery 1 is charged before the secondary battery 1 is connected with the circuit 3. Then, the charged secondary battery 1 is connected with the circuit 3, and in that state, the self-discharge amount of the secondary battery 1 is calculated with the measuring device 2. Based on the calculation result, the quality of the secondary battery 1 is determined.

Specifically, the charged secondary battery 1 is connected with the circuit 3. In this case, the charged secondary battery 1 is connected with the circuit 3 after high-temperature aging, which is normally performed after charging, is completed and the battery voltage becomes stable. However, inspection of the present embodiment itself is conducted at room temperature. A battery voltage VB of the secondary battery 1 is measured after charging and high-temperature aging. The measured value is an initial battery voltage VB1. Next, an output voltage VS of the measuring device 2 is adjusted to coincide with the initial battery voltage VB1. The secondary battery 1 is then connected with the circuit 3. The output voltage VS at this time coincides with the initial battery voltage VB1 of the secondary battery 1.

In this state, the output voltage VS coincides with the initial battery voltage VB1, with the direction of the output voltage VS being opposite to the direction of the battery voltage VB of the secondary battery 1. Accordingly, the voltages VS, VB negate each other, with the result that a circuit current IB of the circuit 3 becomes zero. The output voltage VS of the measuring device 2 is retained in the state of being maintained constant at the initial battery voltage VB1.

Figure 3:
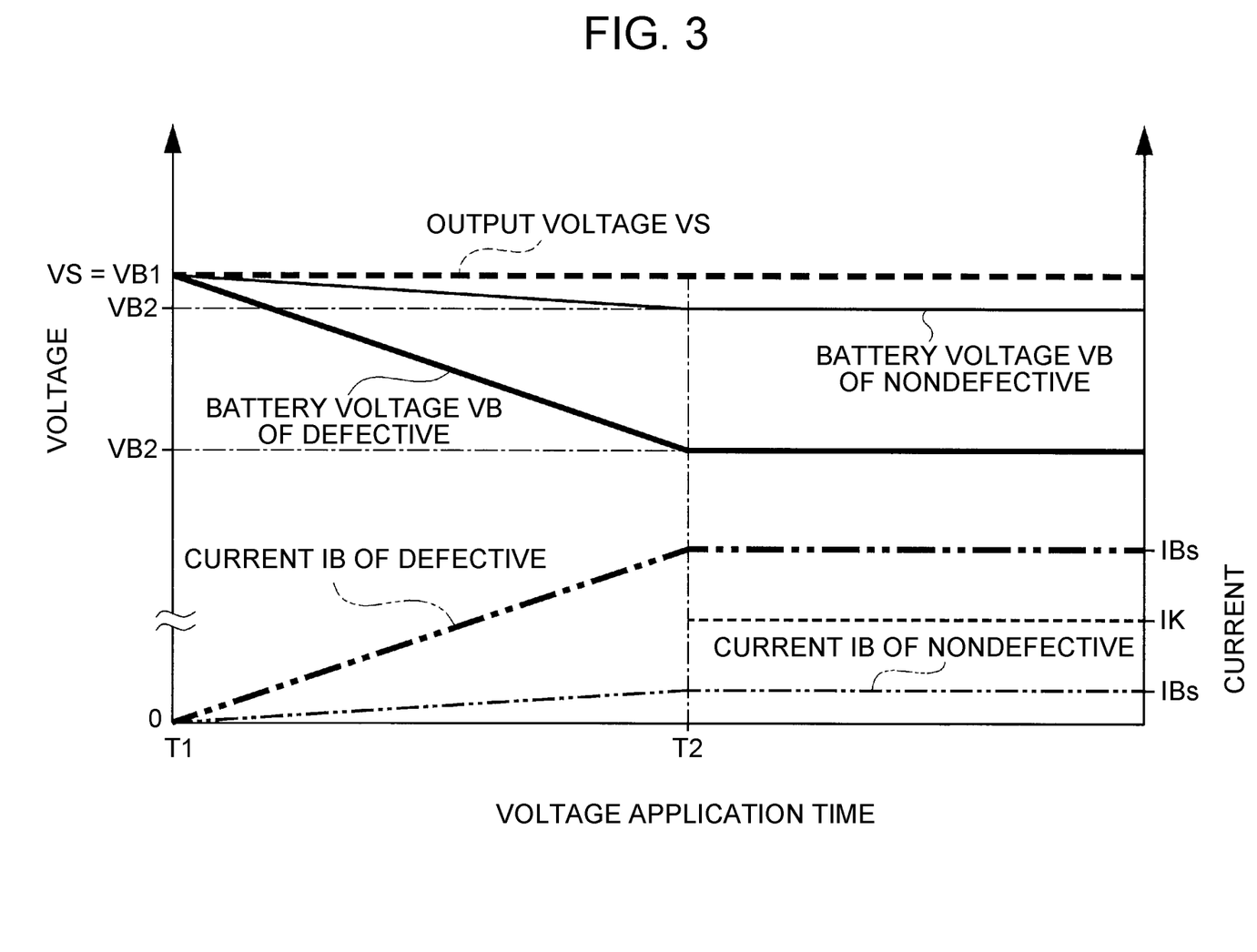
FIG. 3 is a graph view illustrating time-dependent change in voltage and current according to the basic principle of inspection.

The subsequent state of the circuit 3 is illustrated in FIG. 3. In FIG. 3, a horizontal axis represents time, and vertical axes represent a voltage (left side) and a current (right side). With respect to the time expressed by the horizontal axis, time T1 at a left end in FIG. 3 represents timing of starting application of the output voltage VS that is equal to the initial battery voltage VB1 as described above. After time T1, the battery voltage VB gradually drops from the initial battery voltage VB due to self-discharge of the secondary battery 1. As a consequence, the balance between the output voltage VS and the battery voltage VB is disrupted, as a result of which the circuit current IB passes to the circuit 3. The circuit current IB gradually increases from zero. The circuit current IB is directly measured by the ammeter 5. At time T2 after time T1, drop of the battery voltage VB and increase of the circuit current IB are both saturated, and henceforth, both the battery voltage VB and the circuit current IB become constant (VB2, IBs).

As is clear from FIG. 3, the increase of the circuit current IB and the drop of the battery voltage VB are both steeper in a defective secondary battery 1 than in a nondefective secondary battery 1. Accordingly, a circuit current IBs after convergence in the case of the defective secondary battery 1 is larger than a circuit current IBs after convergence in the case of the nondefective secondary battery 1. A battery voltage VB2 of the defective secondary battery 1 after convergence is lower than a battery voltage VB2 of the nondefective secondary battery 1 after convergence.

The reason why the state of the circuit 3 is as illustrated in FIG. 3 after time T1 will be described. First, the battery voltage VB drops due to self-discharge of the secondary battery 1 as described before. Because of the self-discharge, a self-discharge current ID passes to the electromotive element E of the secondary battery 1. The self-discharge current ID is larger, as the self-discharge amount of the secondary battery 1 is larger. The self-discharge current ID is smaller, as the self-discharge amount of the secondary battery 1 is smaller. The secondary battery 1, in which the aforementioned short-circuit resistance Rp is small, tends to have a larger self-discharge current ID.

Meanwhile, the circuit current IB that passes due to a drop of the battery voltage VB after time T1 is a current passing in the direction of charging the secondary battery 1. That is, the circuit current IB acts in the direction of suppressing the self-discharge of the secondary battery 1, and passes in the direction opposite to the self-discharge current ID within the secondary battery 1. When the circuit current IB increases to the same level as the self-discharge current ID, self-discharge substantially stops. This occurs at time T2. Consequently, after time T2, both the battery voltage VB and the circuit current IB become constant (VB2, IBs). Whether or not the circuit current IB has converged may be determined by a known method. For example, the value of the circuit current IB may be sampled at appropriate frequency, and when a change in value becomes smaller than a preset reference, it may be determined that the circuit current IB has converged.

As stated before, the circuit current IB can directly be obtained as a reading value of the ammeter 5. Accordingly, the quality of the secondary battery 1 can be determined by setting a reference value IK for the circuit current IBs after convergence. When the circuit current IBs after convergence is larger than the reference value IK, it can be determined that the secondary battery 1 is defective with a large self-discharge amount. When the circuit current IBs is smaller than the reference value IK, it can be determined that the secondary battery 1 is nondefective with a small self-discharge amount.

The processing time (time T1 to time T2) required in such an inspection method is shorter than the retention time in the method described in Background Art. Since the method involves current measurement, determination accuracy is high. The quality determination using the battery voltage VB2 after convergence described in FIG. 3 is not very good means. This is because the battery voltage VB is not necessarily presented as a correct reading value of the voltmeter 6. This is the end of the description regarding the basic principle of the inspection method of the secondary battery 1 with the measuring device 2. In manufacturing the secondary battery 1, an initial charging step of performing initial charging of an assembled uncharged secondary battery 1 to a preset charged state to provide a charged secondary battery 1, and an inspection step of inspecting the charged secondary battery 1 can be performed. In the inspection step, the aforementioned inspection method may be performed.

Characteristic Point 1 in Present Embodiment: Increasing Output Voltage VS

Hereinbefore, it has been described that the output voltage VS of the measuring device 2 is constant. However, the output voltage VS may not be constant. Rather, the processing time required for determination can further be shortened by properly changing the output voltage VS. This point will be described in the following.

Figure 4:
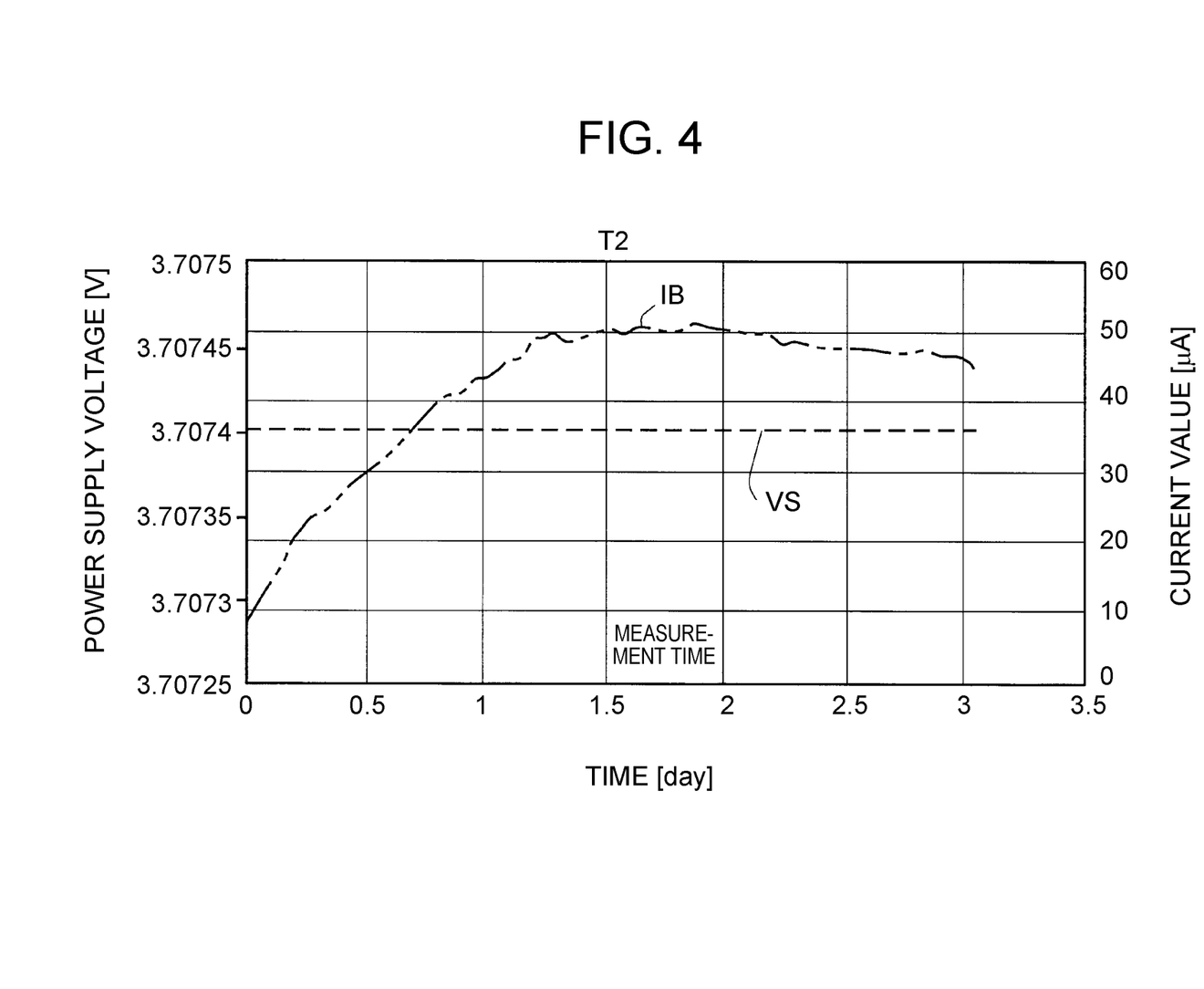
FIG. 4 is a graph view illustrating an example of transition in a circuit current when an output voltage is constant.
Figure 5:
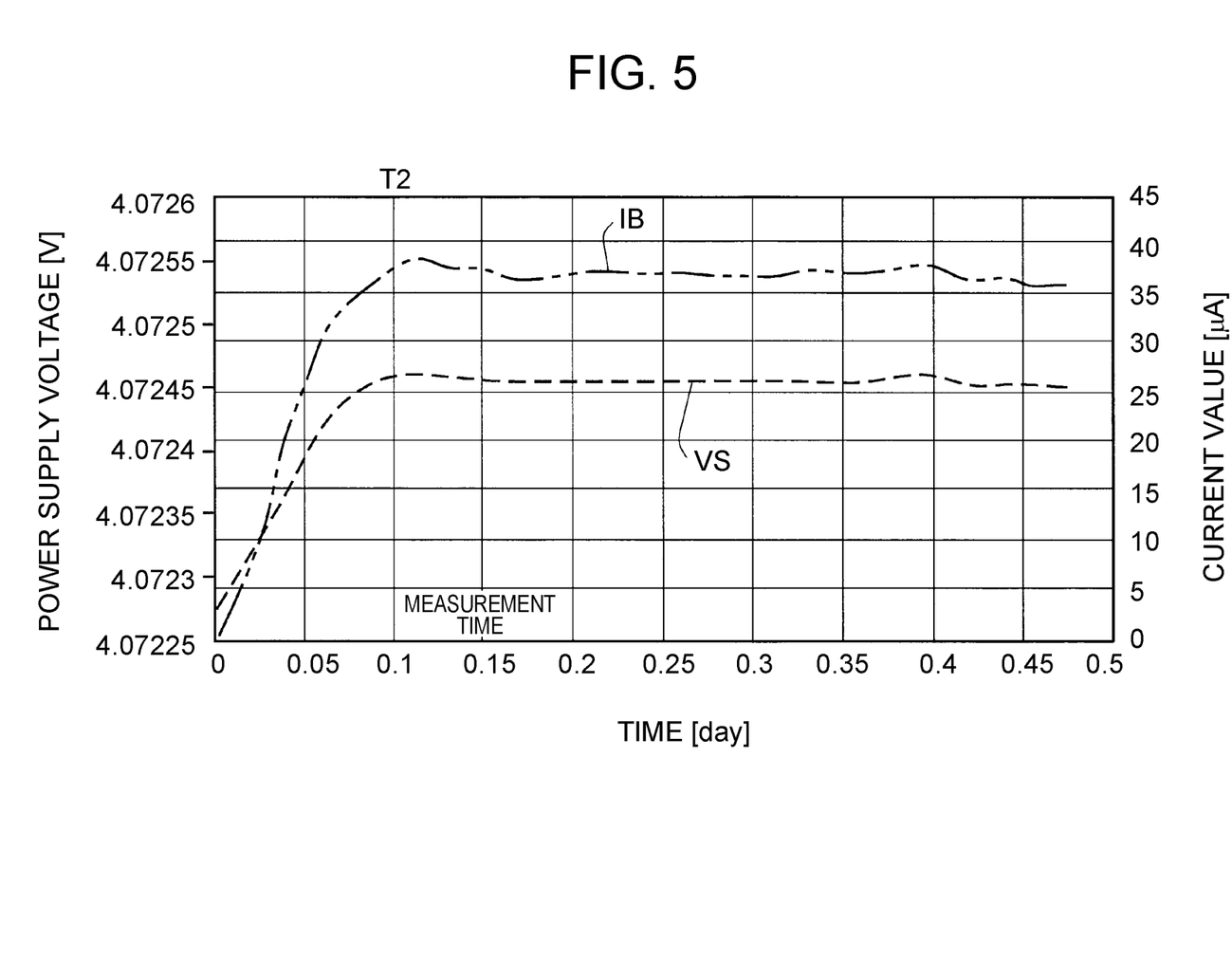
FIG. 5 is a graph view illustrating an example of transition in the circuit current when the output voltage is increased.
Figure 6:
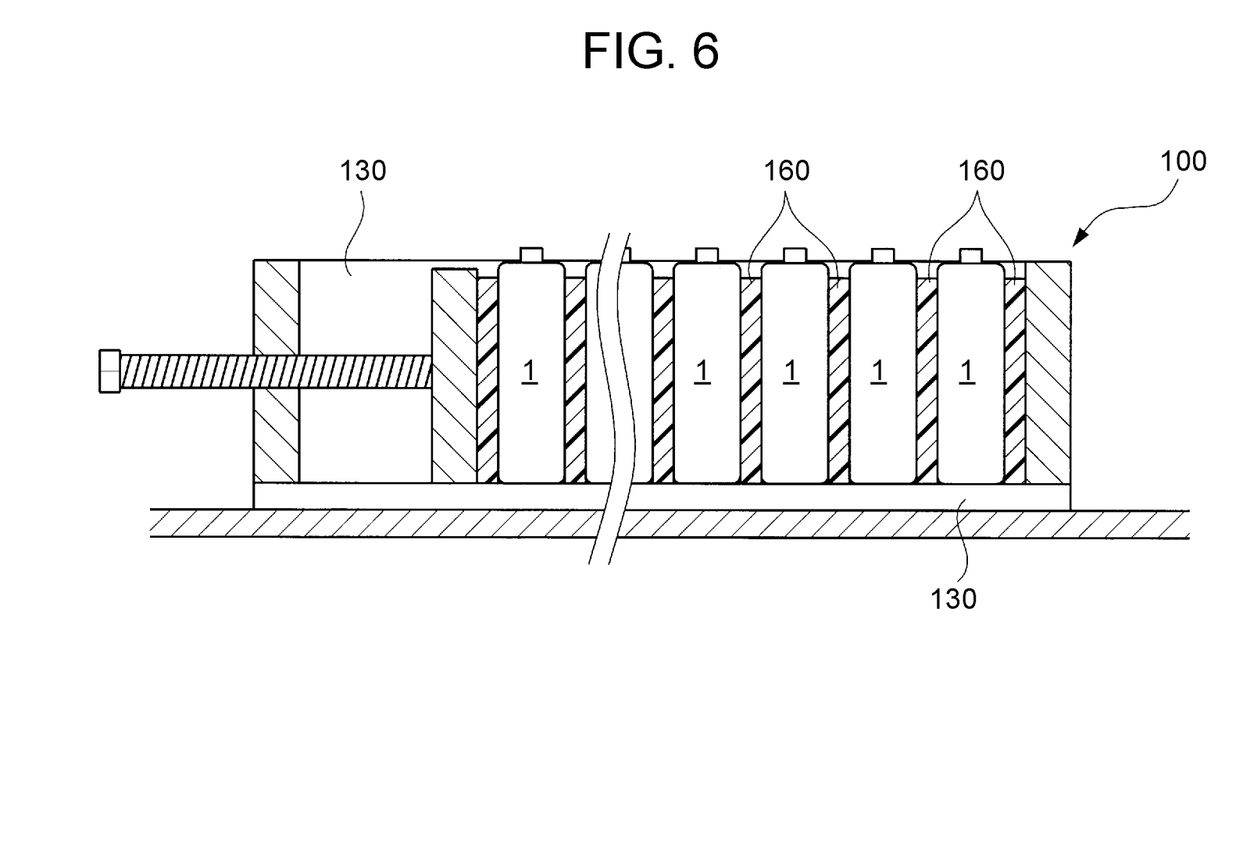
FIG. 6 is a schematic view illustrating the situation where a plurality of secondary batteries to be inspected is bound into a bundle together with a spacer by a binding member in the embodiment.

With reference to FIGS. 4 and 5, advantages of changing the output voltage VS will be described. FIG. 4 is one example of transition of the actual circuit current IB when the output voltage VS is constant as described before. In the example of FIG. 4, the output voltage VS is unchanged from an initially set value, and it takes about 1.5 days for the circuit current IB to converge (time T2). The example of FIG. 4 is a measurement example in the state where a number of secondary batteries 1 are bound into a bundle 100 together with a spacer 160 by a binding member 130 as illustrated in FIG. 6 under the conditions stated below. The secondary batteries 1 in the bundle 100 are each in the state of being pressurized in their thickness direction.

Battery capacity: 4 Ah
Positive-electrode active material: ternary lithium compound
Negative-electrode active material: graphite
Environmental temperature: 25° C.
Binding load: 1 MPa While the measurement time of 1.5 days in FIG. 4 is sufficiently shorter than that in the case where determination is made based on voltage measurement, the processing time can further be shortened by changing the output voltage VS. FIG. 5 illustrates an example of further reduction in the processing time. In the example of FIG. 5, the output voltage VS is increased and converged only in 0.1 day. In the example of FIG. 5, the aforementioned measuring conditions themselves are the same as those of FIG. 4. However, since the secondary batteries 1 to be measured are individually different, the initial value of the output voltage VS and the circuit current IB (IB s) after convergence do not coincide with those of FIG. 4. In the measurement example of FIG. 5, a nondefective secondary battery 1 is used. The circuit current IB (IB s) after convergence becomes larger when a defective secondary battery 1 is used instead.

A description is further given of the case of increasing the output voltage VS as in FIG. 5. First, the circuit current IB in the circuit 3 of FIG. 1 is given by a subsequent expression (1) with the output voltage VS of the measuring device 2, the battery voltage VB, and the parasitic resistance Rx:

$$IB=(VS-VB)/Rx \tag{1}$$

When the output voltage VS is constant, the circuit current IB increases as mentioned before due to a drop of the battery voltage VB caused by the self-discharge of the secondary battery 1. When the circuit current IB increases to the level equal to the self-discharge current ID, discharge of the secondary battery 1 substantially stops. As a consequence, both the battery voltage VB and the circuit current IB henceforth become constant (VB2, IBs) as described before. That is, the circuit current IBs after convergence indicates the self-discharge current ID of the electromotive element E of the secondary battery 1.

In the case of increasing the output voltage VS, the expression (1) is similarly established. However, the rate of increase in the circuit current IB is higher by an increase of the output voltage VS than that in the case where the output voltage VS is constant. Accordingly, the time required until the circuit current IB becomes equal to the self-discharge current ID is shortened. This is the reason why the circuit current IB converges early as mentioned above. However, if the output voltage VS is blindly increased, there is a possibility that the output voltage VS may become too high. If the output voltage VS is too high, the circuit current IB does not appropriately converge, resulting in failure in determination. Hence, it is necessary to restrict the level of increase in the output voltage VS. Specifically, in the present embodiment, the output voltage VS is increased in the range that makes it looks like that the parasitic resistance Rx becomes small in the expression (1). When the parasitic resistance Rx becomes small, the circuit current IB proportionally increases.

Figure 7:
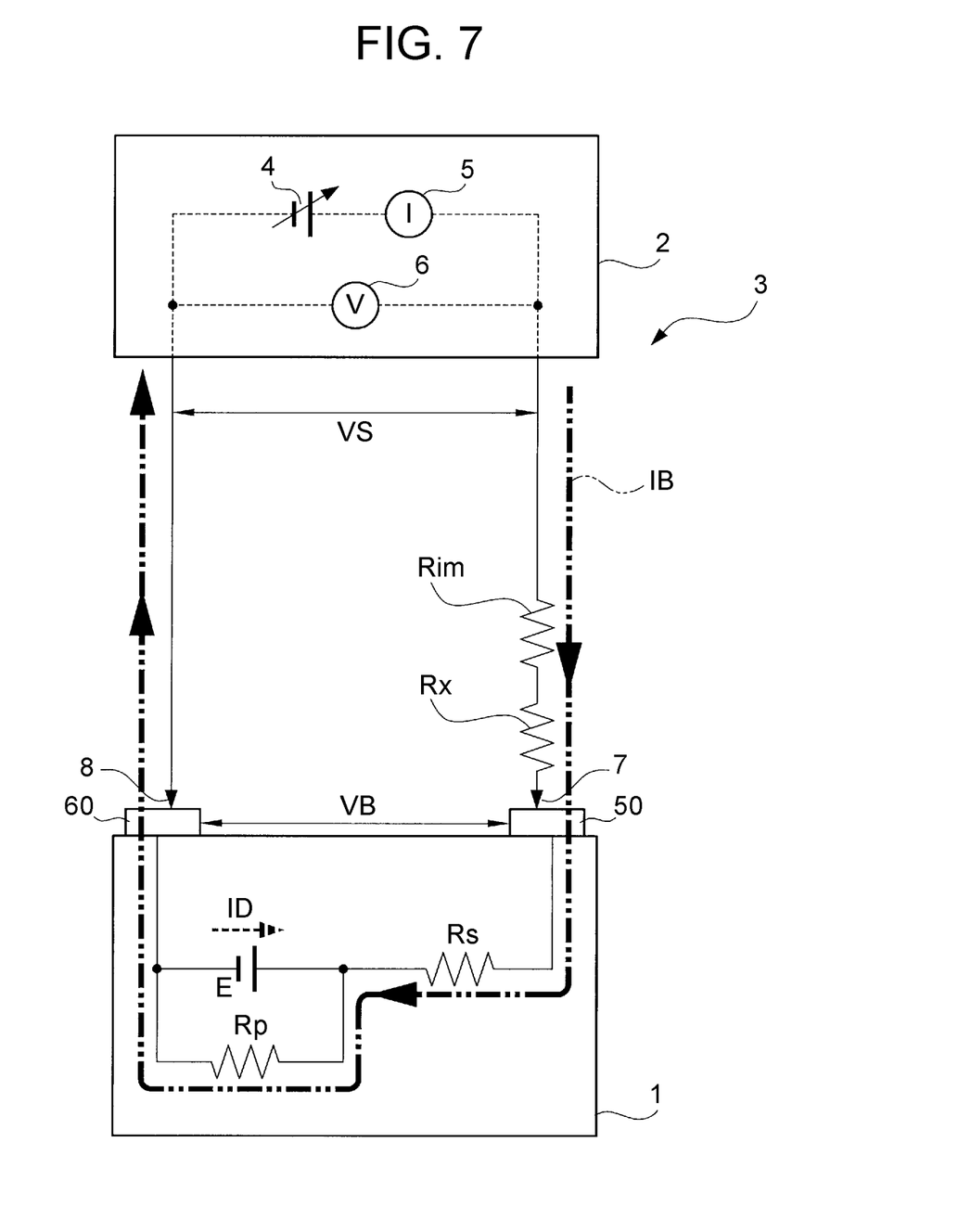
FIG. 7 is a circuit diagram to which a virtual resistance is introduced.

Accordingly, in the present embodiment, the concept of a virtual resistance Rim is introduced as illustrated in FIG. 7. The virtual resistance Rim is a virtual resistance having a negative resistance value or a resistance value of zero. In the circuit diagram of FIG. 7, the virtual resistance Rim is introduced in series with the parasitic resistance Rx. Although such resistance is not present in actuality, the situation where the output voltage VS increases is examined by replacing the situation with a model where the absolute value of a resistance value of the virtual resistance Rim increases in place of the output voltage VS that is set to be constant. However, a sum of the parasitic resistance Rx and the virtual resistance Rim needs to be positive though they reduce. Hereinafter, the sum of the parasitic resistance Rx and the virtual resistance Rim is called a pseudo parasitic resistance Ry. The circuit current in the model where the pseudo parasitic resistance Ry is introduced is expressed as in a subsequent expression (2).

$$IB=(VS-VB)/(Rx+Rim) \quad (2)$$

Here, suppose that the parasitic resistance Rx is 5Ω. In that case, the circuit current IB when the virtual resistance Rim is 0Ω is different from the circuit current IB when the virtual resistance Rim is −4Ω. That is, according to the expression (2), the circuit current IB in the case of −4Ω (equivalent to the resistance after the start of measurement) is five times larger than the circuit current IB in the case of 0Ω (equivalent to the resistance at the start of measurement). This is because the pseudo parasitic resistance Ry (=Rx+Rim) decreases to ⅕ of the case where the virtual resistance Rim is 0Ω.

The aforementioned expression (2) may be deformed into a subsequent expression (3):

$$VS=VB+(Rx+Rim)*IB \quad (3)$$

The expression (3) expresses that the output voltage VS is obtained by adding a product of the pseudo parasitic resistance Ry and the circuit current IB to the battery voltage VB. Since the virtual resistance Rim in the pseudo parasitic resistance Ry is not present in actuality as described before, the expression (3) is established by increasing the output voltage VS up to the voltage obtained by adding the product of the parasitic resistance Rx and the circuit current IB to the battery voltage VB. That is, a value obtained by dividing an increment of the output voltage VS by the circuit current IB corresponds to the absolute value of the virtual resistance Rim.

In the case where measurement is started after the voltage VS is coincided with the initial battery voltage VB1 as described above, the output voltage VS is increased in accordance with the circuit current IB at the time based on the expression (3) at appropriate frequency. The frequency of increasing the output voltage VS is about once every second, for example. The frequency may not be constant. Hence, the margin of increase in the output voltage VS becomes larger, as the increase in the circuit current IB after the start of inspection is larger. When the increase in the circuit current IB converges, the increase in the output voltage VS also converges. As a consequence, measurement as in FIG. 5 can be implemented.

The margin of increase in the output voltage VS corresponding to an increment of the circuit current IB is a product of the parasitic resistance Rx and the circuit current IB as described in the foregoing. That is, when the margin of increase in the output voltage VS is expressed by ΔVS, the margin of increase ΔVS is given by a subsequent expression (4):

$$\Delta VS=Rx*IB \quad (4)$$

However, without being limited to the above value, the margin of increase may be a value obtained by multiplying the product of the expression (4) by a positive coefficient K that is less than one. A specific value of the coefficient K may be any value within the aforementioned range, and may be set in advance. That is, the margin of increase ΔVS may be calculated by a subsequent expression (5):

$$\Delta VS=K*Rx*IB \quad (5)$$

The product of the coefficient K and the parasitic resistance Rx may be obtained as a constant M in advance, and the margin of increase ΔVS of the output voltage VS may be calculated by multiplying the circuit current IB by the constant M. In such a case, the output voltage VS in the middle of inspection may be calculated by a subsequent expression (6):

$$VS=VB+M*IB \quad (6)$$

From a perspective of converging the increase in the circuit current IB early, it is most effective to use, as a margin of increase in the output voltage VS, the product of the expression (4) as it is. However, in that case, there may be a situation where the aforementioned pseudo parasitic resistance Ry becomes a value of minus because of the accuracy of the value of the parasitic resistance Rx and other reasons. If such a situation occurs, a change in the circuit current IB diverges, which makes it difficult to perform required measurement. Accordingly, multiplying the coefficient as mentioned above can avoid the risk of divergence.

Here, in order to actually perform measurement in this control, it is necessary to obtain the value of the parasitic resistance Rx. In the parasitic resistance Rx, a portion of the aforementioned contact resistance between the probes 7, 8 and the terminals 50, 60 is different every time the circuit 3 is assembled. However, the parasitic resistance Rx including the contact resistance may be measured as described below, for example. That is, a reading value of the voltmeter 6 is measured in two states where, in FIG. 1, the output voltage VS of the direct-current power supply 4 is turned off, and both the terminals of the measuring device 2 are connected through an appropriate resistance, and where the connection is disconnected. Hence, the parasitic resistance Rx can be calculated based on the resistance value of the appropriate resistance and on two reading values of the voltmeter 6. Depending on the measurement accuracy required, it may be unnecessary to take into consideration the contact resistance that is different every time. In that case, a preset fixed value may be used as the parasitic resistance Rx.

Thus, the output voltage VS is increased, while the value of the circuit current IB is fed back to the output voltage VS. As a consequence, the increase in the circuit current IB can be converged early. In this way, the processing time required for determination can further be shortened.

Characteristic Point 2 in Present Embodiment: Accurate Setting of Initial Output Voltage VSI A description is now given of accurate setting of an initial value (initial output voltage) VSI of the output voltage. In the aforementioned description, when the secondary battery 1 is connected with the circuit 3, the output voltage VS is adjusted to coincide the output voltage VS with the initial battery voltage VB1 of the secondary battery 1. When the setting accuracy of the initial output voltage VSI is poor, it may take time to converge the circuit current IB. This point will be described first.

Figure 8:
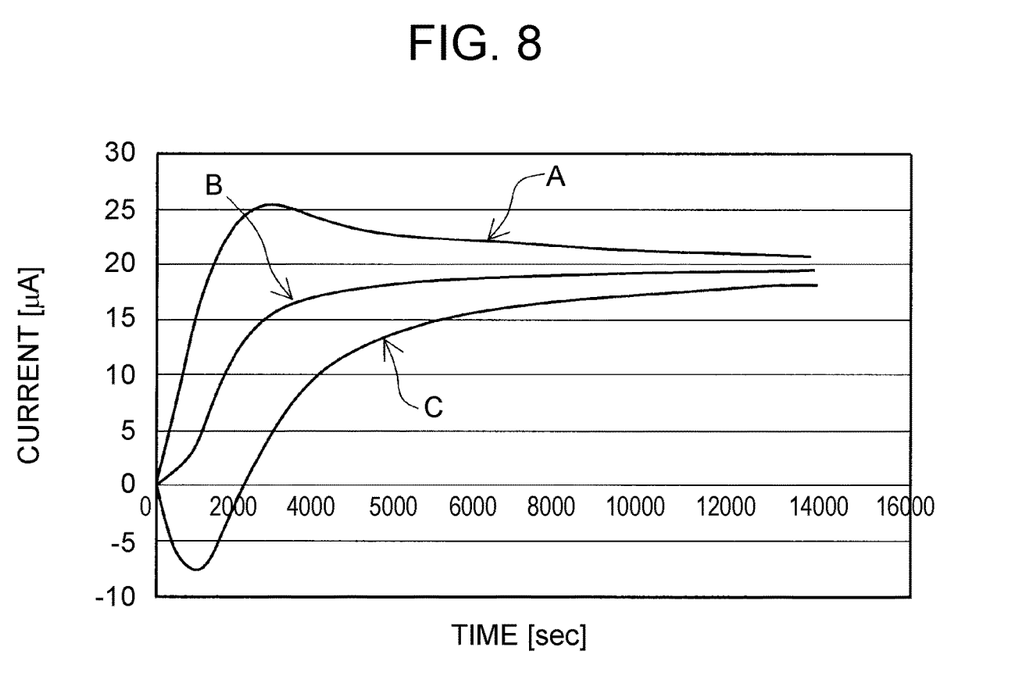
FIG. 8 is a graph view illustrating a difference in converging state of the circuit current due to the height of an initial output voltage.

FIG. 8 illustrates three patterns of increase in the circuit current IB after the start of inspection. These patterns of increase until the circuit current IB converges are present due to the setting accuracy of the initial output voltage VSI. The patterns A, B, C in FIG. 8 appear in the following cases, respectively.

Pattern A: the initial output voltage VSI is slightly higher than the initial battery voltage VB1.
Pattern B: the initial output voltage VSI coincides well with the initial battery voltage VB1.
Pattern C: the initial output voltage VSI is slightly lower than the initial battery voltage VB1.

Although the final convergence value of the circuit current IB is about 20 µA in FIG. 8, the three patterns have the following characteristics in the process of reaching the final convergence, respectively.

Pattern A: the electric current value temporarily exceeds the convergence value (about 2000 seconds to 3000 seconds), and then decreases toward the convergence value (overshoot).
Pattern B: the electric current value increases to the convergence value without reaching a negative value nor causing an overshoot.
Pattern C: the electric current value temporarily takes a value of minus immediately after the start of inspection (to 2000 seconds), and then changes to a value of plus and increases to the convergence value.

As a result, the circuit current IB converges earliest in the pattern B in FIG. 8. That is, in the pattern B, the circuit current IB approaches the convergence value in about 10,000 seconds after the start of inspection. In contrast, in both the pattern A and the pattern C, the circuit current IB is still distant from the convergence value even in about 14,000 seconds after the start of inspection. Thus, the setting accuracy of the initial output voltage VSI influences the convergence time of the circuit current IB. Accordingly, it is desirable to set the initial output voltage VSI with high accuracy.

The procedures for accurate setting of the initial output voltage VSI will be described. In the present embodiment, the initial output voltage VSI is set in conformity to the subsequent procedures
1. Measurement of initial battery voltage VB1
2. Temporary setting of initial output voltage VSI
3. Measurement of circuit current IB
4. Fine adjustment of initial output voltage VSI
5. Finalization of initial output voltage VSI Hereinafter, the procedures are described in order. First, "the procedure 1" relates to measurement of the battery voltage VB at the time before inspection of the secondary battery 1, i.e., the initial battery voltage VB1. The measurement may normally be performed with a voltmeter. The voltmeter 6 in FIG. 1 may be separated from the direct-current power supply 4, and be used for measurement, or other voltmeters may be used.

"The procedure 2" relates to adjusting the output voltage VS of the direct-current power supply 4 in FIG. 1. Adjustment is performed such that the output voltage VS coincides with the initial battery voltage VB1 measured in "the procedure 1". That is how the initial output voltage VSI is set, though adjustment performed at this point of time is temporary setting. This is because the measurement accuracy of the initial battery voltage VB1 measured in "the procedure 1" is not very high.

Next, current measurement in "the procedure 3" is performed. That is, the secondary battery 1 is connected to the circuit 3 of FIG. 1 in the state where the initial output voltage VSI is temporarily set in "the procedure 2". Then, the reading value of the ammeter 5 at that time, i.e., the circuit current IB, is measured. Here, when the initial output voltage VSI that is temporarily set in "procedure 2" coincides with a true initial battery voltage VB1 of the secondary battery 1, a current should not flow to the circuit 3. That is, a measurement value of the circuit current IB should be zero. However, a certain amount of the circuit current IB may be observed in actuality due to the problem of the measurement accuracy in "the procedure 1". When the temporarily set initial output voltage VSI is excessively higher than the true initial battery voltage VB1, a measurement value of plus is obtained as the circuit current IB. When the temporarily set initial output voltage VSI is excessively lower, a measurement value of minus is conversely obtained.

Next, fine adjustment of the initial output voltage VSI is performed. This corresponds to "the procedure 4". The adjustment is performed by finely adjusting the output voltage VS of the direct-current power supply 4, while viewing the reading value of the ammeter 5. Since current measurement can be performed with higher accuracy than voltage measurement, the accuracy of the initial output voltage VSI can be increased by the fine adjustment. Of course, the purpose of the adjustment is to adjust the reading value of the ammeter 5 to zero. When a measurement value of plus is provided in "the procedure 3", fine adjustment to lower the output voltage VS is performed. When a measurement value of minus is provided, fine adjustment to increase the output voltage VS is performed. When a measurement value of zero is obtained at the time of "procedure 3", no adjustment is necessary.

Thus, the output voltage VS after fine adjustment is finalized as a final initial output voltage VSI (procedure 5). Then, inspection by the measuring device 2 is started. When inspection is performed in this way, inspection can be performed in the pattern where the circuit current IB converges early as illustrated as the pattern B in FIG. 8.

Meanwhile, when a measurement value of plus is provided in "the procedure 3", and inspection is started without adjustment, the inspection proceeds in the pattern involving an overshoot that is illustrated as the pattern A in FIG. 8. When inspection is started without adjustment from the state of a measurement value of minus, the inspection proceeds in the pattern involving a backflow period that is illustrated as the pattern C in FIG. 8. When the output voltage VS is increased after the start of inspection as in the aforementioned "characteristic point 1" in particular, divergence and vibration may occur in the circuit current IB if the accuracy of the initial output voltage VSI is poor. Carrying out fine adjustment of "the procedure 4" can prevent such a situation, and enables quality inspection to be conducted in a short time.

Characteristic Point 3 in Present Embodiment: Setting Initial Output Voltage VSI High Next, a description is given of setting the initial output voltage VSI to a high voltage value. In the description so far, the initial value of the output voltage is set such that the reading value of the ammeter 5 becomes zero, that is, the reading value coincides with the initial battery voltage VB1. However, a value different from the initial battery voltage VB1 may be set as the initial output voltage VSI. More specifically, the initial output voltage VSI may be set to a value higher than the initial battery voltage VB1. This also contributes to reduction in the processing time required for determination. This point will be described below.

First, the short-circuit resistance Rp of the secondary battery 1 illustrated in FIG. 1 is examined. As described before, the short-circuit resistance Rp is modeled after a minute metal foreign substance in the electrode laminate 20. Even the nondefective secondary battery 1 that contains no metal foreign substance still has a slight but certain amount of self-discharge. The actual amount of self-discharge in the secondary battery 1 is a sum of the amount of self-discharge still present even in the case of a nondefective and the amount of self-discharge from the minute metal foreign substance. When the resistance of a self-discharge route still present even in the case of the nondefective is defined as a natural short-circuit resistance Rp0, and the resistance of an electric conduction route made by the minute metal foreign substance is defined as a foreign material short-circuit resistance Rp1, the aforementioned short-circuit resistance Rp is a parallel-combined resistance of the natural short-circuit resistance Rp0 and the foreign material short-circuit resistance Rp1 in actuality. Hence, the secondary battery 1 still contains a self-discharge current defined by the battery voltage VB and the natural short-circuit resistance Rp0 even when the secondary battery 1 is nondefective. The defective secondary battery 1 contains still more self-discharge current due to the presence of the foreign material short-circuit resistance Rp1.

Consequently, when the output voltage VS of the direct-current power supply 4 is determined to negate the self-discharge current corresponding to the natural short-circuit resistance Rp0 in the circuit of FIG. 1, a self-discharge current does not flow in the nondefective battery, and the battery voltage VB stays constant. In this case, the circuit current IB stays unchanged and constant. Even when the output voltage VS is determined in this way, the self-discharge current corresponding to the foreign material short-circuit resistance Rp1 still passes if the secondary battery 1 is detective, which results in a drop in the battery voltage VB. Accordingly, the self-discharge current increases. Therefore, quality determination can be performed in a shorter time as compared with the case where the output voltage VS is coincided with the initial battery voltage VB1 as described before.

A description is given of how to determine the initial output voltage VSI in the inspection with the measuring device 2 for negation. First, a self-discharge current ID0 in the case of a nondefective is given by a subsequent expression (7):

$$ID0 = VB/Rp0 \tag{7}$$

The self-discharge current ID0 can be negated when the circuit current IB given by the aforementioned expression (1) coincides with the self-discharge current ID0 in expression (7). Consequently, a following expression is established:

$$(VS-VB)/Rx = VB/Rp0$$

When the above expression is deformed such that the output voltage VS is solved, the initial output voltage VSI is obtained. In that case, the aforementioned initial battery voltage VB1 is used as the battery voltage VB. Consequently, the initial output voltage VSI is given by a subsequent expression (8):

$$VSI = VB1 * \{1+(Rx/Rp0)\} \tag{8}$$

Here, the natural short-circuit resistance Rp0 is practically determined by the design of the secondary battery 1. Therefore, the natural short-circuit resistance Rp0 can be treated as a known value depending on the specification of the secondary battery 1. The measuring method of the parasitic resistance Rx is as described before. Consequently, since the right-hand side of the expression (8) includes known values only, the initial output voltage VSI can be determined. The initial output voltage VSI determined in this way is a voltage higher by "VB1*(Rx/Rp0)" than the initial battery voltage VB1. Thus, starting the inspection with a high initial output voltage VSI enables the circuit current IB to converge early.

The self-discharge current ID0 when the battery voltage VB is set as the initial battery voltage VB1 in the aforementioned expression (7) is an initial self-discharge current in the nondefective secondary battery 1. When this self-discharge current ID0 is set as a standard self-discharge current IDI, the expression (8) can be expressed as a subsequent expression (9) with use of the standard self-discharge current IDI. Since the standard self-discharge current IDI is determined by the natural short-circuit resistance Rp0 which is a design value, and the initial battery voltage VB1 and the parasitic resistance Rx which are measurement values, the initial output voltage VSI can be calculated by an expression (9):

$$VSI = VB1 + (IDI*Rx) \tag{9}$$

Figure 9:
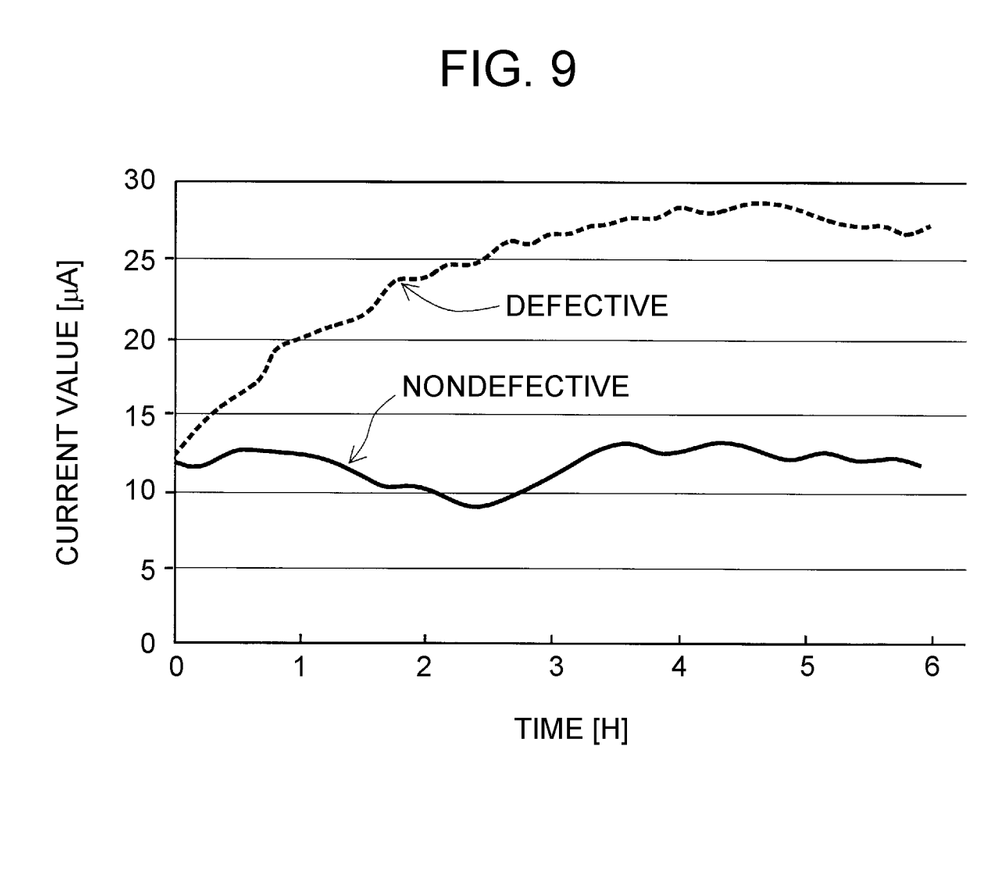
FIG. 9 is a graph view illustrating an example of transition in the circuit current when the initial output voltage is set higher than an initial battery voltage.

In this case, if the circuit current IB transits as a constant value without increasing even after the start of inspection, the secondary battery 1 in that case can be determined to be nondefective based on the above description. When the circuit current IB increases after the start of inspection, the secondary battery 1 in that case is defective. The transition of the circuit current IB is illustrated in FIG. 9. Therefore, quality determination can be made without waiting for the convergence of the circuit current IB. That is, a determination value of about 3 μA to 5 μA may be set as a margin of increase in the circuit current IB, and the quality determination may be made based on whether or not the margin of increase in the circuit current IB after the start of inspection is equal to or above the determination value. Determination time may be set to 20 minutes to 30 minutes after the start of inspection.

In the present embodiment, it is desirable to measure the circuit current IB under the condition that the temperature of the secondary battery 1 is constant with respect to the temperature at the point of time when the initial battery voltage VB1 is measured. When the temperature of the secondary battery 1 changes in the middle of inspection, the battery voltage VB and the circuit current IB are also influenced by the change. Accordingly, since the change may also influence determination of convergence and increase of the circuit current IB, such influence is eliminated.

Hence, it is desirable to repeatedly acquire the temperature of the secondary battery 1 using a temperature sensor, before measurement of the initial battery voltage VB1, in the middle of the measurement, and in the middle of subsequent measurement of the circuit current IB, in parallel with the process of these measurements. The inspection is continued only when fluctuation of the acquired temperature is within a preset acceptable fluctuation range. With such configuration, only when the fluctuation of the temperature of the secondary battery 1 stays within the acceptable fluctuation range, the inspection can be continued.

As described in detail in the foregoing, according to the present embodiment, the presence or absence of an internal short-circuit of the secondary battery 1 is inspected based on current measurement instead of voltage measurement. Here, increasing the output voltage VS of the power supply after the start of inspection enables the secondary battery 1 to be inspected earlier. Moreover, generation of an overshoot and a reversed-direction period of the circuit current IB are prevented by accurately coinciding the initial output voltage VSI of the power supply with the initial battery voltage VB1. Since the initial output voltage VSI of the power supply is intentionally set higher than the initial battery voltage VB1 so as to negate the self-discharge current ID0 when the secondary battery 1 is nondefective, it becomes possible to perform inspection based only on the presence or absence of the increase in the circuit current IB. Thus, the present embodiment implements the inspection method of the secondary battery 1 that can swiftly determine the quality of the secondary battery 1 regardless of variation in various conditions. The manufacturing method of the secondary battery 1 that manufactures the secondary battery 1 while performing such inspection as one process is also implemented.

The present embodiment is in all respects illustrative and is not considered as the basis for restrictive interpretation. Therefore, the present disclosure can naturally make various modifications and improvements without departing from the scope of the present disclosure. For example, in the description of the embodiment, it has been described that the output voltage VS is increased from a voltage that is equal to the initial battery voltage VB1. It has also been described that the initial value VSI of the output voltage VS is intentionally set higher than the initial battery voltage VB1. Based on the above description, an inspection method as a modification of the present disclosure may also be devised. In this method, the initial value VSI of the output voltage VS is set to a value that is still higher than the output voltage VS after convergence of the circuit current IB, and then while the output voltage VS is decreased with the passage of time, a convergence time of the circuit current IB is acquired. That is, the direction of the circuit current IB passed to the circuit 3 in the current application step is not limited to the direction of charging the secondary battery 1, but may be the direction of discharging the secondary battery 1.

Even when the initial value VSI of the output voltage VS is intentionally set highly than the initial battery voltage VB1, it is desirable to accurately set the output voltage VS at the stage where the output voltage VS, used as the basis of the setting, is coincided with the initial battery voltage VB1. The inspection method of the present embodiment can be executed not only for the secondary batteries immediately after being manufactured as new articles but also for used secondary batteries for purposes such as remanufacturing second-hand assembled batteries, for example. The electrical storage devices to be determined are not limited to secondary batteries, but may be capacitors, such as electrical double layer capacitors, and lithium ion capacitors.

What is claimed is:

1. An inspection method of an electrical storage device, comprising:
    constituting a circuit comprising the electrical storage device being charged and a power supply; and
    passing a current by the power supply in a direction of charging the electrical storage device or in a direction of discharging the electrical storage device, wherein an output voltage of the power supply is changed from an initial value with a passage of time; and
    when the current flowing from the power supply to the electrical storage device stops increasing and becomes saturated in a converging state, determining quality of the electrical storage device based on a saturated value of the current in the converging state.

2. The inspection method according to claim 1, further comprising setting the initial value to a voltage value before start of an inspection of the electrical storage device being charged, wherein
    in passing the current, the output voltage after the start of the inspection is changed such that a margin of increase in the output voltage is increased in direct proportion to an increase of the current, until the current and the output voltage are saturated, and
    in determining the quality of the electrical storage device, the quality of the electrical storage device is determined based on time required until the current converges into the steady state.

3. The inspection method according to claim 2, wherein the output voltage is calculated, by using a constant that is a product of a parasitic resistance value of the circuit and a preset positive coefficient that is less than one, and by obtaining, as the output voltage, a sum of a voltage of the electrical storage device and a product of a value of the current of the circuit and the constant.

4. The inspection method according to claim 2, wherein in passing the current, the voltage of the power supply at the start of the inspection is set to a sum of the initial value, and a product of an initial self-discharge current of the electrical storage device without a defect and a parasitic resistance of the circuit.

5. The inspection method according to claim 1, wherein the output voltage is calculated, by using a virtual resistance value of a virtual resistance that is assumed to be connected in series with parasitic resistance value of the circuit, and has a negative or zero resistance value, and by obtaining, as the output voltage, a sum of the voltage of the electrical storage device and a product of a value of the current of the circuit and a sum of the parasitic resistance value of the circuit and the virtual resistance value.

6. The inspection method according to claim 1, further comprising:
    before constituting the circuit, acquiring a voltage value before a start of inspection of the electrical storage device being charged;
    before passing the current, coinciding the output voltage with the voltage value; and
    determining an initial output voltage of the power supply in passing the current by adjusting the output voltage such that the current passing through the circuit in a state after the output voltage is coincided with the voltage value is negated.

7. The inspection method according to claim 1, wherein in passing the current, the voltage of the power supply at a start of inspection is set to a sum of a product of an initial self-discharge current of the electrical storage device without a defect and a parasitic resistance of the circuit, and the voltage of the electrical storage device, and in determining the quality of the electrical storage device, the quality of the electrical storage device is determined based on whether or not an increase in the current after the start of the inspection is within a preset level.

8. The inspection method according to claim 1, further comprising measuring a voltage value before a start of inspection of the electrical storage device being charged, wherein measuring the voltage value and passing the current are performed under a condition that the electrical storage device has a constant temperature.

9. The inspection method according to claim 8, further comprising, before measuring the voltage value and in a middle of measuring the voltage value and passing the current, repeatedly acquiring a temperature of the electrical storage device using a temperature sensor, while measuring the voltage value and passing the current, and continuing to measure the voltage value and pass the current when fluctuation of the temperature being acquired is within a preset acceptable fluctuation range.

10. The inspection method according to claim 1, further comprising measuring the voltage value before a start of inspection of the electrical storage device being charged, wherein the electrical storage device has an external appearance of a flat square shape, and measuring the voltage value and passing the current are performed under a condition that the electrical storage device is pressurized in a thickness direction of the electrical storage device.

11. The inspection method of claim 1, further comprising:
prior to connecting the electrical storage device to the circuit for inspecting the electrical storage device, performing an initial charging of the electrical storage device being assembled and uncharged to a preset charged state to provide the electrical storage device being charged.

* * * * *